(12) United States Patent
Koh

(10) Patent No.: US 7,427,528 B2
(45) Date of Patent: Sep. 23, 2008

(54) CMOS IMAGE SENSOR AND METHOD FOR FABRICATING THE SAME

(75) Inventor: Kwan Ju Koh, Bucheon (KR)

(73) Assignee: Dongbuanam Semiconductor, Inc., Seoul (KR)

( * ) Notice: Subject to any disclaimer, the term of this patent is extended or adjusted under 35 U.S.C. 154(b) by 104 days.

(21) Appl. No.: 11/302,387

(22) Filed: Dec. 14, 2005

(65) Prior Publication Data

US 2006/0131625 A1 Jun. 22, 2006

(30) Foreign Application Priority Data

Dec. 21, 2004 (KR) .................... 10-2004-0109603

(51) Int. Cl.
*H01L 21/00* (2006.01)
(52) U.S. Cl. .............................. 438/57; 438/60; 438/75
(58) Field of Classification Search ................ 257/292, 257/294; 438/57, 59, 60, 69, 70, 73, 75, 438/199, 200
See application file for complete search history.

(56) References Cited

U.S. PATENT DOCUMENTS 6,979,588 B2 * 12/2005 Jeong et al. .................. 438/70
2004/0080638 A1 4/2004 Lee

FOREIGN PATENT DOCUMENTS

| KR | 10-2002-0058459 | 7/2002 |
| KR | 10-2004-0036087 | 4/2004 |
| KR | 1020040059942 A | 7/2004 |

* cited by examiner

*Primary Examiner*—Kevin M Picardat
(74) *Attorney, Agent, or Firm*—McKenna Long & Aldridge LLP

(57) ABSTRACT

A CMOS image sensor and a method for fabricating the same in which color balance is enhanced by forming photodiodes to have a depth varied according to the wavelength of incident light to be received through a color filter layer. The predetermined depth varies, from shallow to deep, as the wavelength of the band of incident light increases, such that the predetermined depth is shallowest for the shortest wavelength, e.g., blue light, of the bands of incident light and is deepest for the longest wavelength, e.g., red, of the bands of incident light.

8 Claims, 4 Drawing Sheets

CMOS IMAGE SENSOR AND METHOD FOR FABRICATING THE SAME

CROSS REFERENCE TO RELATED APPLICATION

This application claims the benefit of Korean Patent Application No. 10-2004-0109603, filed on Dec. 21, 2004, which is hereby incorporated by reference for all purposes as if fully set forth herein.

BACKGROUND OF THE INVENTION

1. Field of the Invention

The present invention relates to image sensors, and more particularly, to a complementary metal-oxide-semiconductor (CMOS) image sensor and a method for fabricating the same in which the photodiode projection depth is controlled to obtain improved color balance.

2. Discussion of the Related Art

Image sensors are semiconductor devices for converting an optical image into an electrical signal and include charge-coupled devices and complementary metal-oxide-semiconductor (CMOS) image sensors.

A typical charge-coupled device includes an array of photodiodes converting light signals into electrical signals, a plurality of vertical charge-coupled devices formed between each vertical photodiode aligned in a matrix-type configuration and vertically transmitting electrical charges generated from each photodiode, a horizontal charge-coupled device for horizontally transmitting the electrical charges transmitted by each of the vertical charge-coupled devices, and a sense amplifier for sensing and outputting the horizontally transmitted electrical charges. Charge-coupled devices have the disadvantages of requiring a complicated driving method, high power consumption, and a complicated fabrication process with a multi-phased photo process. Additionally, in a charge-coupled device integration of complementary circuitry such as a control circuit, a signal processor, and an analog-to-digital converter into a single-chip device is difficult, thereby their use hinders the development of compact-sized (thin) products, e.g., digital still cameras and digital video cameras, using such image sensors.

CMOS image sensors, on the other hand, adopt CMOS technology that uses control circuit and a signal processing circuit as a peripheral circuit and adopts switching technology which detects an image by allowing outputs to be sequentially detected using MOS transistors provided in correspondence with the number of pixels arrayed. Additionally, a CMOS image sensor uses CMOS fabrication technology, i.e., a simple fabrication method using fewer photolithography steps, and results in a device exhibiting low power consumption.

In the aforementioned CMOS image sensors, typically, the photodiode is the active device for generating an optical image based on incident light signals. In such a CMOS image sensor, wherein each photodiode senses incident light and the corresponding CMOS logic circuit converts the sensed light into an electrical signal according to input wavelength, the photodiode's photosensitivity increases as more light is able to reach the photodiode. One way of enhancing a CMOS image sensor's photosensitivity is to improve its "fill factor," i.e., the degree of surface area covered by the photodiodes with respect to the entire surface area of the image sensor. Accordingly, the fill factor is improved by increasing the area responsive to incident light. The concentration of incident light onto the photodiode is further facilitated when the quantum efficiency at all wavelengths (white light) is "1," which represents a balanced transmission to the photodiodes across the spectrum to include complimentary components of red light, blue light, and green light received at the photodiodes.

To concentrate the incident light on one or more photodiodes, a device exhibiting excellent light transmittance, such as a convex microlens for refracting incident light, may be provided. The convex microlens is used to redirect any light that may otherwise be incident to the image sensor outside the immediate area of the photodiodes. In a color image sensor, such a microlens having a predetermined curvature (i.e., a convex lens) may be provided over a color filter layer for passing the light of each color (wavelength). As shown in FIG. 1, a CMOS image sensor according to the related art, includes three photodiodes provided for generating electrical signals according to the intensity and wavelength of incident light.

Referring to FIG. 1, a CMOS image sensor according to the related art includes a p-type epitaxial layer 11 grown on a p-type semiconductor substrate 10 defining a device isolation region and an active region. A field oxide layer 12 is formed in the device isolation region of the semiconductor substrate 10 to isolate light-signal input regions of blue (B) light, green (G) light, and red (R) light from one another. First, second, and third n-type regions 13, 14, and 15, to serve as the respective photodiodes of a color image sensor, are formed of equal depths by ion-implantation in the active region of the semiconductor substrate 10. Subsequently, a series of gate electrodes 17 are formed on the active region of the semiconductor substrate 10 by interposing a gate insulating film 16 patterned with the gate electrodes. Dielectric spacers 18 are formed at the lateral sides of each gate electrode 17. A dielectric interlayer 19 is formed over the entire surface of the semiconductor substrate 10 including the gate electrodes 17. A color filter layer 20 comprised of blue, green, and red filters (i.e., a color filter array) is formed on the dielectric interlayer 19 to correspond to the first, second, and third n-type regions 13, 14, and 15. A planarization layer 21 is formed over the entire surface of the semiconductor substrate 10 including the color filter layer 20. A plurality of microlenses 22 is formed on the planarization layer 21 to correspond to the respective color filters of the color filter layer 20.

In the operation of the CMOS image sensor, incident light is concentrated by the microlenses and received by the photodiodes in each of the n-type regions. During this light signal reception, light of each color penetrates the silicon layer by a predetermined depth according to wavelength, with longer wavelengths, e.g., red light, achieving a deeper penetration.

Since the photodiodes of the CMOS image sensor according to the related art, as described above, are respectively formed of the first, second, and third n-type regions 13, 14, and 15, they each have the same projection depth regardless of the intended spectral reception, i.e., red, green, or blue light. However, because the penetration depth of incident light is different for the various colors (wavelengths), having photodiodes with the same projection depth regardless of the intended spectral reception results in lower absorption coefficients for colors having longer wavelengths, e.g., red light. This variation in absorption causes unduly low levels at the red end of the spectrum and thus a color imbalance. Furthermore, with its longer wavelength and its deeper penetration, the absorption of red light may extend beyond the lower limits of the corresponding photodiode (active) region, and cause crosstalk, i.e., a transfer of charges between adjacent active regions.

SUMMARY OF THE INVENTION

Accordingly, the present invention is directed to a CMOS image sensor and a method for fabricating the same that substantially obviates one or more problems due to limitations and disadvantages of the related art.

One advantage of the present invention is that it can provide a CMOS image sensor and a method for fabricating the same, which achieves color balance across an arrangement of photodiodes for color image detection.

Another advantage of the present invention is that it can provide a CMOS image sensor, by which the photodiodes have varied projection depths according to the wavelength of light incident to the corresponding color filter of a color filter layer.

Another advantage of the present invention is that it can provide a CMOS image sensor, by which the projection depth of an active region (the photodiode) is deeper for longer wavelengths of incident light.

Another advantage of the present invention is that it can provide a CMOS image sensor, in which crosstalk is reduced.

Another advantage of the present invention is that it can provide a suitable method for fabricating any of the above CMOS image sensors.

Additional advantages, examples of and features of the invention will be set forth in part in the description which follows, and in part will be apparent from the description or by practice of the invention.

To achieve these and other advantages in accordance with an embodiment of the present invention, as embodied and broadly described herein, there is provided a CMOS image sensor having a plurality of active devices for receiving each of a corresponding plurality of bands of incident light according to wavelength. The sensor comprises a semiconductor substrate; and an active region for each band of incident light, respectively formed over the surface of the semiconductor substrate to have a predetermined depth relative to each band of incident light.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention.

In the drawings.

DETAILED DESCRIPTION OF THE INVENTION

Reference will now be made in detail to some of the embodiments of the present invention, examples of which are illustrated in the accompanying drawings. Wherever possible, like reference designations will be used throughout the drawings to refer to the same or similar parts. Also, layer thickness, relative proportions, and other dimensions as shown may be exaggerated or distorted to more clearly depict semiconductor components and materials, including layers, films, depositions, and other areas.

FIGS. 2A-2G illustrate process steps of fabricating a CMOS image sensor according to an embodiment of the present invention.

Figure 1:
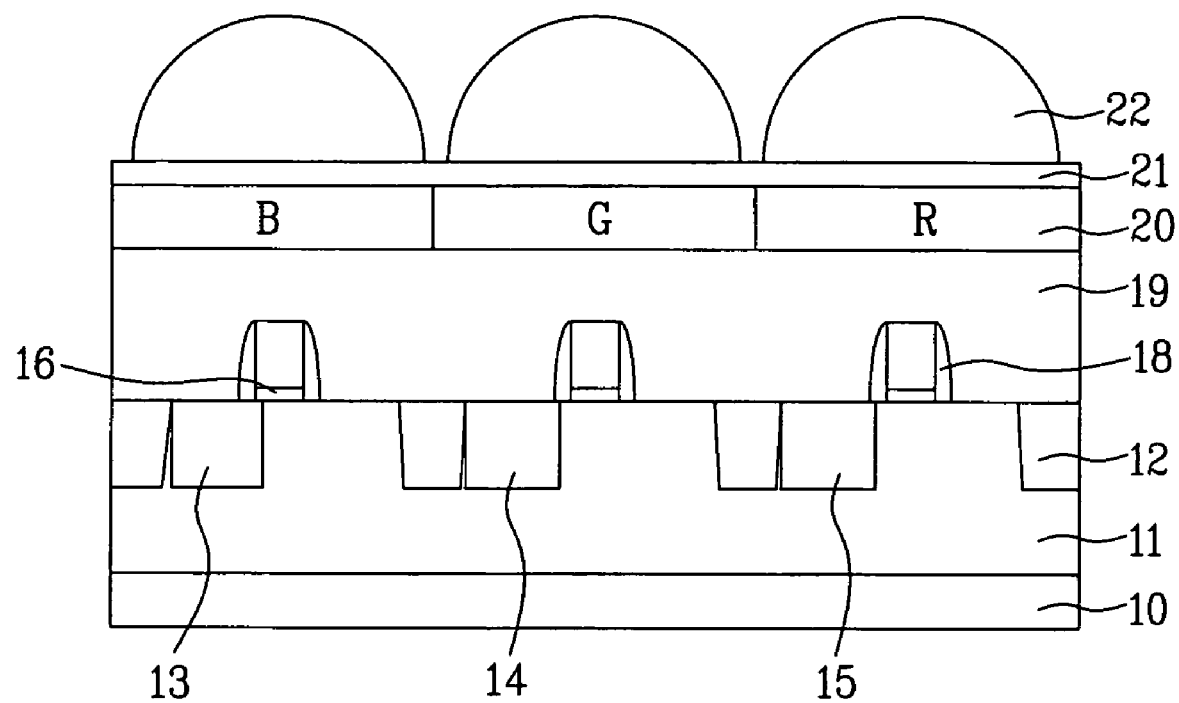
FIG. 1 is a sectional view illustrating a related art CMOS image sensor.
Figure 2A:
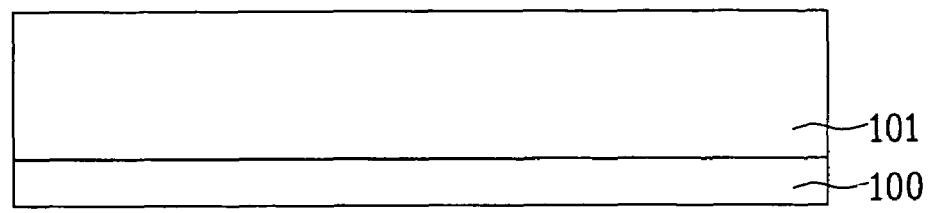
FIGS. 2A-2G are sectional views illustrating process steps of fabricating a CMOS image sensor according to an embodiment of the present invention.

As shown in FIG. 2A, a $p^-$-type epitaxial layer 101 is formed on a $p^{++}$-type semiconductor substrate 100. A monocrystal silicon substrate is used as the semiconductor substrate 100.

Figure 2B:
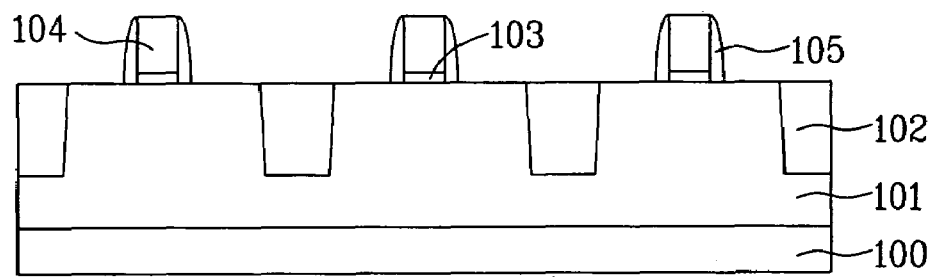

As shown in FIG. 2B, a field oxide layer 102 is formed by a shallow trench isolation process or a local oxidation of silicon process in a device isolation region of the semiconductor substrate 100 to define an active region. Subsequently, a gate insulating film 103 and a material layer for gate electrode formation are formed on the epitaxial layer 101. The gate electrode material may be polysilicon or a metal of a thickness of approximately 2000-3000 Å. Portions of the gate electrode material layer and the gate insulating film 103 are selectively removed by photolithographic and etching processes, thereby forming gate electrodes 104 within the active region defined by the filed oxide layer 102. The gate electrodes 104 shown are those of a transfer transistor per unit pixel. A layer (not shown) of insulating material is deposited over the entire surface of the semiconductor substrate 100 including the gate electrodes 104 and then etched back to leave dielectric spacers 105 formed on the lateral sides of each gate electrode.

Figure 2C:
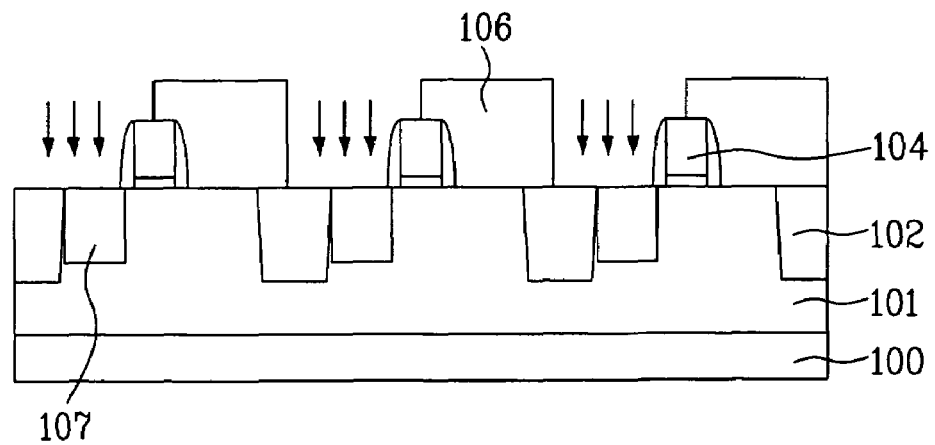

As shown in FIG. 2C, photoresist is deposited over the entire surface of the semiconductor substrate 100 including the gate electrodes 104 and is patterned by known exposing and developing processes, to form a first photoresist pattern 106 having openings corresponding to where each of a plurality of n-type regions (as photodiodes for receiving blue, green, and red light) are to be formed by ion-implantation. Lightly doped n-type impurity ions are firstly implanted using the first photoresist pattern 106 as a mask, thereby forming a first n-type region 107 in the exposed surfaces of the epitaxial layer 101. The exposed surfaces extend between a point over one of the field oxides to a point over the one of the gate electrodes, such that the field oxides and the gate electrodes also serve as part of the mask. In one embodiment of the present invention, the photodiodes may be separated by a constant interval. It should be understood that, although the first n-type region 107 will be used for the photodiode receiving blue light, the same ion-implantation (same depth) occurs for each of the other colors.

Figure 2D:
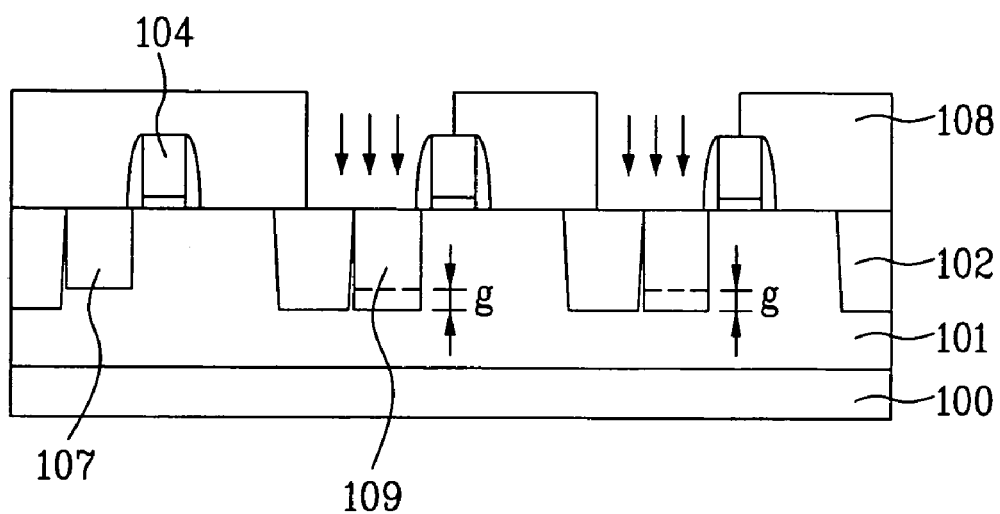

As shown in FIG. 2D, after the first photoresist pattern 106 is removed, a second photoresist is deposited over the entire surface of the semiconductor substrate 100 and is patterned by exposure and development processes to form a second photoresist pattern 108, which has openings for the green and red regions only, i.e., photodiodes for receiving green and red light. Lightly doped n-type impurity ions are again implanted using the second photoresist pattern 108 as a mask, thereby forming a second n-type region 109 in the exposed surfaces of the epitaxial layer 101, namely, in the green and red regions, each of which is thus imparted with an increased depth that is deeper by a distance "g" with respect to the first n-type region 107 (the blue region). The achieved ion concentration and implantation depth of the n-type impurity ions in the green and red regions may depend on the structure and design characteristics of the particular device being fabricated. In an exemplary embodiment, the above formation of the second n-type region 109 (the green region) achieves a depth that is approximately 10-50% greater than that of the first n-type region 107 (the blue region).

Figure 2E:
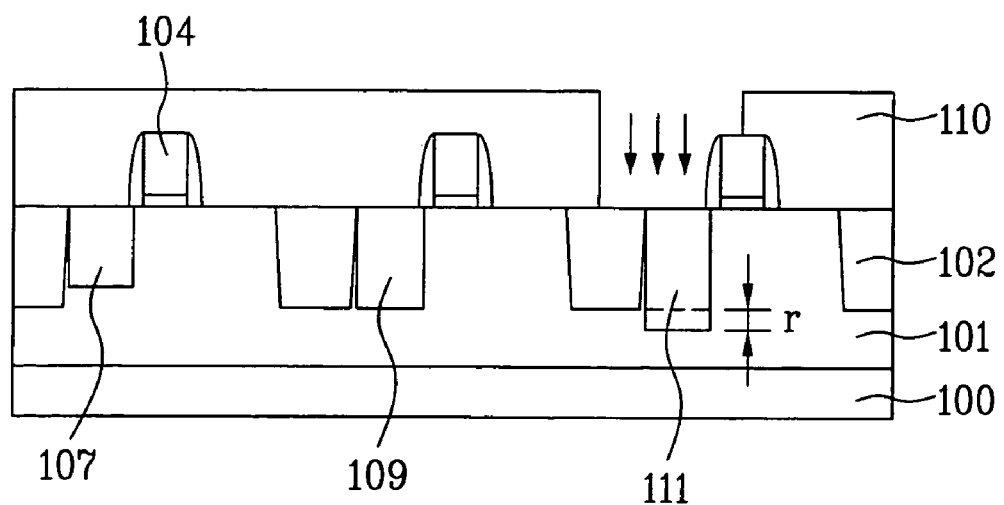

As shown in FIG. 2E, after the second photoresist film 108 is removed, a third photoresist is deposited over the entire surface of the semiconductor substrate 100 and is patterned by exposure and development processes to form a third photoresist pattern 110, which has openings for the red region only. Lightly doped n-type impurity ions are again implanted using the third photoresist pattern 110 as a mask, thereby forming a third n-type region 111 (the red region) in the exposed surfaces of the epitaxial layer 101. By this process, the red region is thereby imparted with an increased depth that is deeper by a distance "r" with respect to the depth of region 109 (the green region) as obtained by the second ion-implantation (FIG. 2D). According to an exemplary embodiment, the distance r is approximately 10-50% of the green region's ultimate depth.

Accordingly, in an embodiment of the method for fabricating a CMOS image sensor according to the present invention, the depth of each photodiode region, which is the area of the active device, is varied in accordance with the wavelength of light incident to each region, such that each photodiode region has a predetermined depth relative to each band of incident light among a plurality of bands of incident light corresponding to the color filter layer. Thus, the predetermined depth varies, from shallow to deep, as the wavelength of the band of incident light increases, such that the predetermined depth is shallowest for the shortest wavelength of the band of incident light and is deepest for the longest wavelength of the band of incident light. As such, the blue region (the n-type region 107) is the shortest, and the red region (the n-type region 111) is the longest.

In one embodiment of the present invention, three steps of ion-implantation are performed at equal energy levels, using sequential mask patterns including aperture sets of three holes (blue, green, and red), two holes (green and red), and one hole (red), respectively. In another embodiment of the present invention, three steps of ion-implantation are performed at increasing energy levels, and/or using sequential mask patterns including aperture sets of one hole (blue), one hole (green), and one hole (red), respectively.

Figure 2F:
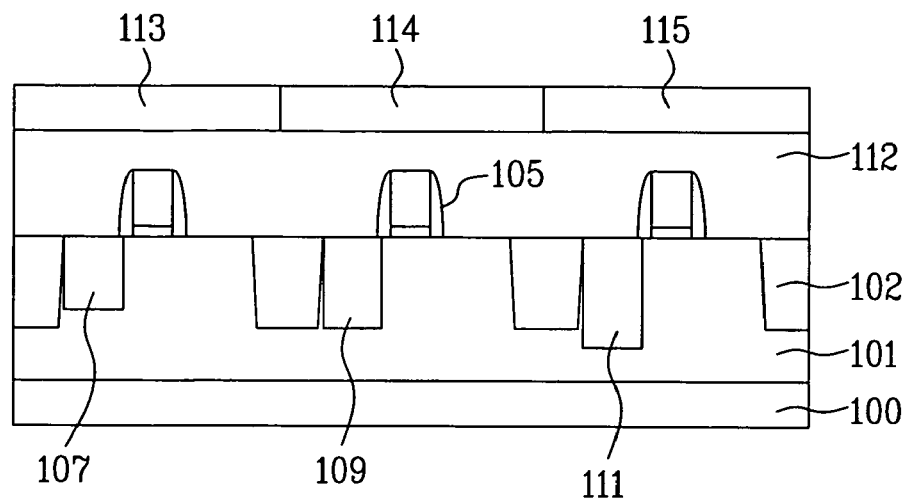

As shown in FIG. 2F, after the third photoresist pattern 110 is removed, a dielectric interlayer 112 is formed over the entire surface of the semiconductor substrate 100. Subsequently, the color filter layer is formed to have an interlaced plurality of color filters. A blue filter 113 is formed on the dielectric interlayer 112 to correspond to the n-type region 107, a green filter 114 is formed thereon to correspond to the n-type region 109, and a red filter 115 is formed thereon to correspond to the n-type region 111. In this manner, the blue filter 113 is disposed over the n-type region 107 having the least implantation depth of n-type impurity ions, and the red filter 115 is disposed over the n-type region 111 having the greatest implantation depth of n-type impurity ions. Thus, the blue, green, and red filters 113, 114, and 115 for filtering light of each band of wavelengths are sequentially formed by depositing salt resists, which then undergo exposure and development processes.

Figure 2G:
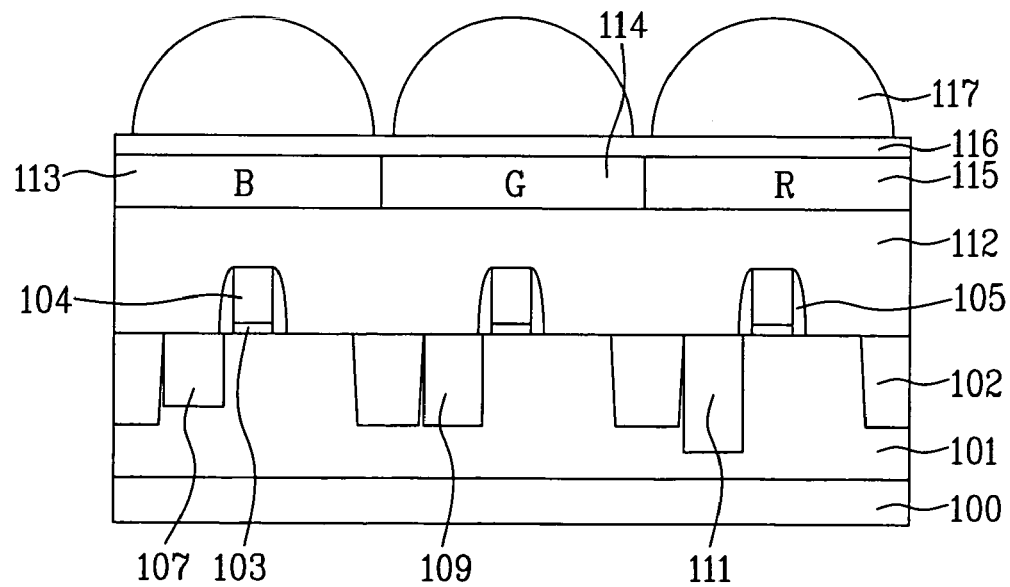

As shown in FIG. 2G, a planarization layer 116 is formed over the entire surface of the semiconductor substrate 100 including the color filter layer, and a material layer for microlens formation is deposited on the planarization layer 116. A plurality of microlenses 117, corresponding to the color filters 113, 114, and 115 of the color filter layer, are formed by selectively patterning the microlens material layer and then reflowing the patterned material layer. An oxide film such as resist or tetra-ethyl-ortho-silicate may be used as the microlens material layer.

In the CMOS image sensor of the present invention, the distance between the n-type region 111 and the semiconductor substrate 100 is the shortest, and the distance between the n-type region 107 and the semiconductor substrate 100 is the longest. A reduction in the distance between the p-type semiconductor substrate and the n-type regions 107, 109, and 111 reduces the potential for crosstalk to occur between adjacent pixels, which is most severe for the longest wavelength, i.e., red light. If the distance between the p-type semiconductor substrate and the n-type regions 107, 109, and 111 is reduced, recombination of electron hole pairs is actively made during inflow of optical charges to reduce the concentration of drift electrons, thereby reducing crosstalk. Therefore, in an embodiment of the present invention, the overall depth of the field oxide layer 102 is made to be at least equal to the greatest (i.e., red) depth among the n-type regions.

Accordingly, a CMOS image sensor according to the present invention is shown in FIG. 2G in which the p-type epitaxial layer 101 is grown on the p-type semiconductor substrate 100 defined by a device isolation region and an active region. The field oxide film 102 is formed in the device isolation region to isolate input regions of green light, red light, and blue light. The n-type regions 107, 109, and 111, serving as photodiodes, are formed of varying depths in the active region. The gate electrodes 104 are formed on the active region by interposing the gate insulating film 103. The dielectric spacers 105 are formed at the lateral sides of each gate electrode 104. The dielectric interlayer 112 is formed over the entire surface of the semiconductor substrate 100 including the gate electrodes 104. The color filters 113, 114, and 115 of the color filter layer are formed on the dielectric interlayer 112 in correspond with the formations of the n-type regions 107, 109, and 111. The planarization layer 116 is formed over the entire surface of the semiconductor substrate 100 including the color filter layers 113, 114, and 115. The microlenses 117 are formed on the planarization layer 116 to correspond to the respective color filter layers 113, 114 and 115.

In the CMOS image sensor and the method for fabricating the same according to an embodiment of the present invention as described above, since the photodiode where the red light enters is formed to be deeper than another photodiode, characteristics of red signals can be improved to distribute optical charges caused by the red light in the photodiode. Since the distance between the photodiode corresponding to the red light and the p-type semiconductor substrate is reduced, crosstalk of adjacent pixels can be reduced.

It will be apparent to those skilled in the art that various modifications can be made in the present invention without departing from the spirit or scope of the invention. Thus, it is intended that the present invention cover such modifications and variations provided they come within the scope of the appended claims and their equivalents.

What is claimed is:

1. A method for fabricating a CMOS image sensor having a plurality of active devices for receiving each of a corresponding plurality of bands of incident light according to wavelength, the method comprising:

forming a field oxide layer over a semiconductor substrate;

forming over the semiconductor substrate an active region for each band of incident light;

forming a dielectric interlayer covering each active region over the semiconductor substrate;

forming a color filter layer on the dielectric interlayer, the color filter layer having an interlaced plurality of color filters corresponding to the respective formations of each active region;

forming a planarization layer on the color filter layer; and forming, on the planarization layer, a microlens above each color filter of the color filter layer;

wherein each active region has a predetermined depth relative to each band of incident light and such that there is at least one active region having a lesser depth than the field oxide layer;

wherein the plurality of color filters includes a red filter, a green filter, and a blue filter;

wherein each active region is formed as a series of first, second, and third photodiodes corresponding to the blue filter, the green filter, and the red filter, respectively;

wherein forming the active region comprises:

depositing a first photoresist film over the semiconductor substrate and patterning the first photoresist film to define respective regions for the first, second and third photodiodes;

implanting impurity ions, at a first ion implantation energy, into each of the respective regions using the patterned first photoresist film as a mask to form the first photodiode;

depositing a second photoresist film over the semiconductor substrate and patterning the second photoresist film to expose only the second and third photodiode regions;

implanting impurity ions, at a second ion implantation energy, into each of the exposed second and third photodiode regions using the patterned second photoresist film as a mask to form the second photodiode;

depositing a third photoresist film over the semiconductor substrate and patterning the third photoresist film to expose only the third photodiode region; and implanting impurity ions, at a third ion implantation energy, into the exposed third photodiode region using the patterned third photoresist film as a mask to form the third photodiode.

2. The method according to claim 1, wherein the third photodiode is formed to have a greater depth than the first and second photodiodes.

3. The method according to claim 1, wherein the first photodiode is formed to have a lesser depth than the second and third photodiodes.

4. The method according to claim 1, wherein the third photodiode is formed to have a depth that is approximately 10-50% greater than the depth of the second photodiode.

5. The method according to claim 1, wherein the second photodiode is formed to have a depth that is approximately 10-50% greater than the depth of the first photodiode.

6. The method according to claim 1, wherein the first, second, and third photodiodes are formed by three ion-implantation steps performed at equal ion energies, using sequential mask patterns having aperture sets for the first, second, and third photodiodes, for the second and third photodiodes, and for the third photodiode, respectively.

7. The method according to claim 1, wherein the first, second, and third photodiodes are formed by three ion-implantation steps performed at different ion energies, using sequential mask patterns having aperture sets for the first photodiode, for the second photodiode, and for the third photodiode, respectively.

8. The method according to claim 1, wherein the second ion implantation energy is higher than the first ion implantation energy and wherein the third ion implantation energy is higher than the second ion implantation energy.

\* \* \* \* \*